(12) United States Patent  
Son et al.

(10) Patent No.: US 12,550,669 B2
(45) Date of Patent: Feb. 10, 2026

(54) SUBSTRATE TRANSFER MODULE AND SEMICONDUCTOR MANUFACTURING EQUIPMENT

(71) Applicant: SEMES CO., LTD., Cheonan-si (KR)

(72) Inventors: Duk Hyun Son, Cheonan-si (KR); Je Hee Lee, Uijeongbu-si (KR)

(73) Assignee: SEMES CO., LTD., Cheonan-si (KR)

( * ) Notice: Subject to any disclaimer, the term of this patent is extended or adjusted under 35 U.S.C. 154(b) by 525 days.

(21) Appl. No.: 18/083,558

(22) Filed: Dec. 18, 2022

(65) Prior Publication Data

US 2023/0197492 A1    Jun. 22, 2023

(30) Foreign Application Priority Data

Dec. 20, 2021  (KR) ......................... 10-2021-0182542

(51) Int. Cl.
*H01L 21/677* (2006.01)
*H01L 21/67* (2006.01)
*H01L 21/687* (2006.01)

(52) U.S. Cl.
CPC .. *H01L 21/67742* (2013.01); *H01L 21/67196* (2013.01); *H01L 21/68707* (2013.01)

(58) Field of Classification Search
CPC ......... H01L 21/67389; H01L 21/67196; H01L 21/68707; H01L 21/67772; H01L 21/67766; H01L 21/67748; H01L 21/67742; H01L 21/67769; H01L 21/67167; H01L 21/67173; H01L 21/67017; B01D 53/0446; B01D 53/0476; B01D 53/261; B01D 53/263; B01D 46/0039

See application file for complete search history.

(56) References Cited

U.S. PATENT DOCUMENTS 5,013,384 A * 5/1991 Mellink ............ H01L 21/67017
                                                                414/217
5,733,024 A * 3/1998 Slocum ............ H01L 21/67778
                                                                414/940

(Continued)

FOREIGN PATENT DOCUMENTS

JP    10-067429    3/1998
JP    2004-165331    6/2004

(Continued)

OTHER PUBLICATIONS

Office Action from the Korean Intellectual Property Office dated Aug. 30, 2023.
Office Action of the Japan Patent Office dated Jan. 30, 2024.

*Primary Examiner* — Glenn F Myers

(57) ABSTRACT

A substrate transfer module, which provides clean environment to prevent particles from moving to a substrate, and semiconductor manufacturing equipment including the same. The substrate transfer module of the semiconductor manufacturing equipment includes a transfer chamber providing a transfer space of the substrate, having a chamber groove lowered by a predetermined height from a bottom surface to form a gap with respect to the bottom surface, a guide member provided in an inside portion of the transfer chamber, and a substrate transfer robot configured to move along the guide member and to transfer the substrate.

20 Claims, 13 Drawing Sheets

(56) References Cited

U.S. PATENT DOCUMENTS

| | | | | |
|---|---|---|---|---|
| 6,050,891 A | * | 4/2000 | Nering | B01D 46/46 |
| | | | | 454/192 |
| 7,438,514 B2 | * | 10/2008 | Lee | H01L 21/67772 |
| | | | | 414/217 |
| 2008/0166210 A1 | * | 7/2008 | Hudgens | H01L 21/67742 |
| | | | | 901/41 |
| 2022/0403506 A1 | * | 12/2022 | Sadeghi | H01L 21/67161 |
| 2024/0047254 A1 | | 2/2024 | Amikura et al. | |

FOREIGN PATENT DOCUMENTS

| | | |
|---|---|---|
| JP | 2018-107366 | 7/2018 |
| JP | 2021-141136 | 9/2021 |
| KR | 10-1991-0001367 | 1/1991 |
| KR | 10-0914739 | 2/2009 |
| KR | 10-1132261 | 3/2012 |
| KR | 10-2088748 | 3/2020 |

\* cited by examiner

SUBSTRATE TRANSFER MODULE AND SEMICONDUCTOR MANUFACTURING EQUIPMENT

CROSS REFERENCE TO RELATED APPLICATION

The present application claims priority to Korean Patent Application No. 10-2021-0182542, filed Dec. 20, 2021, the entire contents of which is incorporated herein for all purposes by this reference.

BACKGROUND OF THE INVENTION

Field of the Invention

The present disclosure relates generally to a substrate transfer module and semiconductor manufacturing equipment including the same, the substrate transfer module being configured to maintain clean environment.

Description of the Related Art

A semiconductor (or display) manufacturing process is a process for manufacturing a semiconductor device on a substrate (e.g., wafer), and for example, includes exposing, depositing, etching, ion implanting, cleaning, etc. In order to perform each manufacturing process, semiconductor manufacturing facilities performing each process are provided in a clean room of a semiconductor manufacturing plant, and a process is performed on a substrate inserted into the semiconductor manufacturing facilities.

In general, the semiconductor manufacturing equipment includes a process treatment module for performing a process treatment, a substrate transfer module transferring the substrate to the process treatment module and removing the process-completed substrate from the process treatment module.

Meanwhile, as miniaturization of the semiconductor manufacturing process progresses, a high level of control for particles that can affect a yield of the substrate is required, and a demand for the clean environment in the semiconductor manufacturing equipment is increasing. In addition to maintaining the clean environment with respect to the substrate in the process treatment module, it is important to maintain the clean environment also in the substrate transfer module so as to prevent the particles from being transferred to the substrate.

SUMMARY OF THE INVENTION

Accordingly, an embodiment of the present disclosure provides a substrate transfer module and semiconductor manufacturing equipment including the same, the substrate transfer module being configured to maintain clean environment so as to prevent particles from being transferred to a substrate.

The technical problem of the present disclosure is not limited to the above mention, and other problem not mentioned will be clearly understood by those skilled in the art from the description below.

According to an embodiment of the present disclosure, a substrate transfer module of semiconductor manufacturing equipment includes: a transfer chamber providing a transfer space of a substrate, having a chamber groove lowered by a predetermined height from a bottom surface to form a gap with respect to the bottom surface; a base plate provided at an upper end of the bottom surface; a guide member provided in an inside portion of the transfer chamber; and a substrate transfer robot configured to move along the guide member and to transfer the substrate.

According to the embodiment of the present disclosure, the substrate transfer module may include wherein the guide member may be provided at an upper end of the base plate, and a plurality of through holes may be formed on a region of the base plate, the region corresponding to the chamber groove.

According to the embodiment of the present disclosure, the chamber groove may have a chamber groove center portion and a plurality of chamber groove pattern portions, the chamber groove center portion being formed at a center region of the bottom surface and the plurality of chamber groove pattern portions protruding on opposite lateral surfaces of the chamber groove center portion.

According to the embodiment of the present disclosure, fastening holes may be respectively formed on the base plate and the bottom surface in regions between the chamber groove pattern portions, and the base plate may be securely provided on the bottom surface by fastening members coupled to the fastening holes of the bottom surface.

According to the embodiment of the present disclosure, at least one opening portion may be formed in the chamber groove.

According to the embodiment of the present disclosure, the opening portion may be connected to a discharge tube configured to discharge air inside the transfer chamber to an outside space.

According to the embodiment of the present disclosure, vacuum pressure applied to the discharge tube may allow particles collected inside a space between the base plate and the chamber groove to be discharged to the outside space.

According to another embodiment of the present disclosure, a substrate transfer module of semiconductor manufacturing equipment includes: a transfer chamber providing a transfer space of a substrate; a base plate comprising a mounting portion and a plate groove, the mounting portion being securely mounted to a bottom surface of the transfer chamber and the plate groove located above the mounting portion by a predetermined height to form a gap with respect to the mounting portion; a guide member provided at an upper end of the base plate; and a substrate transfer robot configured to move along the guide member and to transfer the substrate.

According to the embodiment of the present disclosure, a plurality of through holes may be formed on the plate groove of the base plate.

According to the another embodiment of the present disclosure, the plate groove may have a plate groove center portion and a plurality of plate groove pattern portions, the plate groove center portion being formed at a center region of the bottom surface and the plurality of plate groove pattern portions protruding on opposite lateral surfaces of the plate groove center portion.

According to the embodiment of the present disclosure, fastening holes may be respectively formed on the bottom surface and the mounting portion in regions between the plate groove pattern portions, and the base plate may be securely provided in the bottom surface by fastening members coupled to the fastening holes.

According to the embodiment of the present disclosure, at least one opening portion may be formed on a region of the bottom surface of the transfer chamber, the region corresponding to the plate groove.

According to the embodiment of the present disclosure, at least one opening portion may be formed on a region of the bottom surface of the transfer chamber, the region corresponding to the plate groove.

According to the embodiment of the present disclosure, the opening portion of the bottom surface may be connected to a discharge tube configured to discharge air inside the transfer chamber to an outside space.

According to the embodiment of the present disclosure, vacuum pressure applied to the discharge tube may allow foreign materials collected between the base plate and the bottom surface to be discharged to the outside space.

According to an embodiment of the present disclosure, semiconductor manufacturing equipment may include: a loading part accommodating a cassette in which a substrate may be stored, and configured to remove the substrate out of the cassette or to put the substrate into the cassette; a process treatment module configured to perform process treatment with respect to the substrate; and a substrate transfer module configured to transfer the substrate between the loading part and the process treatment module, wherein the substrate transfer module may include: a transfer chamber providing a transfer space of the substrate, and having a chamber groove lowered by a predetermined height from a bottom surface to form a first gap with respect to the bottom surface and having at least one opening portion; a base plate including a mounting portion and a plate groove, the mounting portion being securely mounted to the bottom surface of the transfer chamber and the plate groove located above the mounting portion by a predetermined height to form a second gap with respect to the mounting portion; a guide member provided at an upper end of the base plate; and a substrate transfer robot configured to move along the guide member and to transfer the substrate.

According to an embodiment of the present disclosure, a plurality of through holes may be formed on the plate groove of the base plate.

According to an embodiment of the present disclosure, a chamber groove may have a chamber groove center portion and a plurality of chamber groove pattern portions, the chamber groove center portion being formed at a center portion of the bottom surface and the plurality of chamber groove pattern portions protruding on a lateral surface of the chamber groove center portion, and the plate groove may have a plate groove center portion and a plurality of plate groove pattern portions, the plate groove center portion being formed at a center region of the bottom surface and the plurality of plate groove pattern portions protruding from opposite lateral surfaces of the plate groove center portion.

According to an embodiment of the present disclosure, fastening holes may be respectively formed on the bottom surface and the mounting portion in regions between the chamber groove pattern portions, and the base plate may be securely provided on the bottom surface by fastening members coupled to the fastening holes.

According to an embodiment of the present disclosure, at least one opening portion may be formed in the chamber groove.

According to an embodiment of the present disclosure, the opening portion may be connected to a discharge tube configured to discharge air inside the transfer chamber to an outside space, and vacuum pressure applied to the discharge tube may allow foreign materials collected between the base plate and the bottom surface to be discharged to the outside space.

According to the present disclosure, the particles are collected into and discharged from the space formed by the gap between the bottom surface of the transfer chamber and the base plate, so that transfer of the particles from the substrate transfer module to the substrate can be prevented.

The effect of the present disclosure is not limited to the above mention, and other effects not mentioned will be clearly understood by those skilled in the art from the description below.

DETAILED DESCRIPTION OF THE INVENTION

Figure 1:
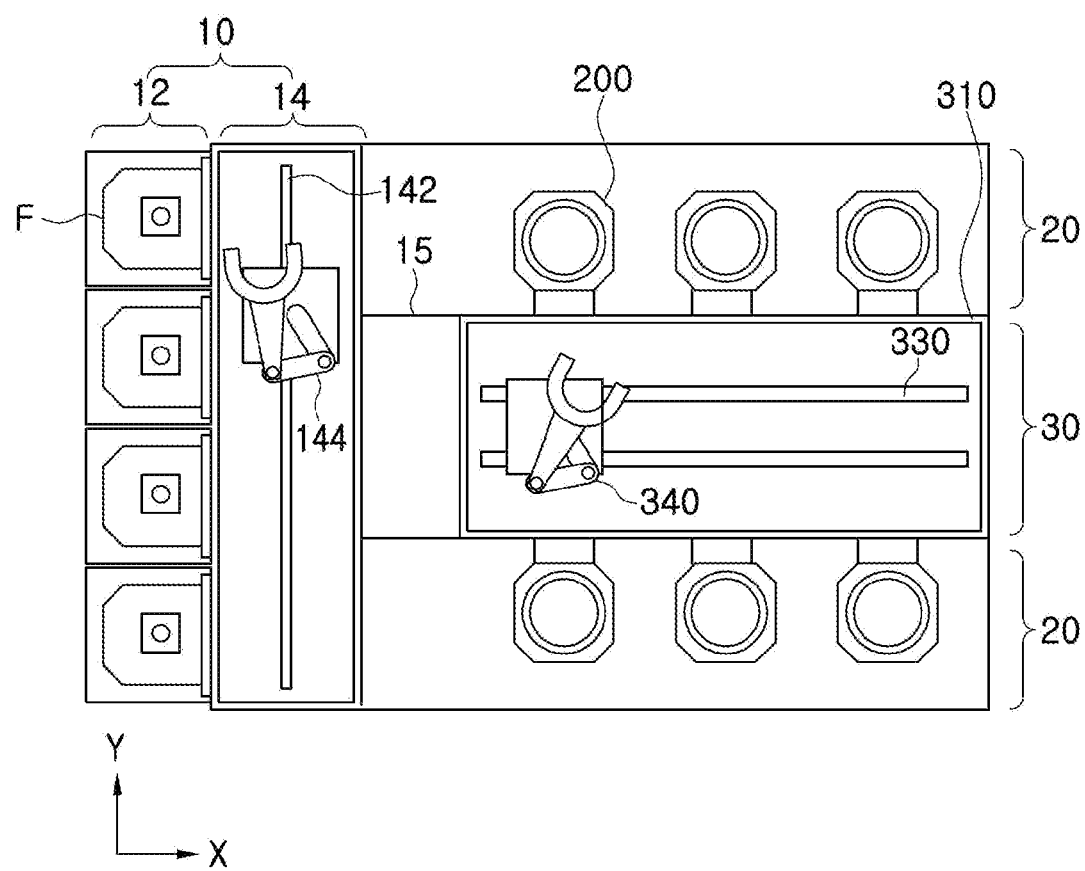
FIG. 1 is a view showing a schematic structure of semiconductor manufacturing equipment to which the present disclosure may be applied.

Hereinbelow, exemplary embodiments of the present disclosure will be described in detail with reference to the accompanying drawings such that the present disclosure can be easily embodied by one of ordinary skill in the art to which the present disclosure belongs. The present disclosure may be changed to various embodiments and the scope and spirit of the present disclosure are not limited to the embodiments described hereinbelow.

In the following description, if it is decided that the detailed description of known function or configuration related to the present disclosure makes the subject matter of the present disclosure unclear, the detailed description is omitted, and the same reference numerals will be used throughout the drawings to refer to the elements or parts with same or similar function or operation.

Furthermore, in various embodiments, an element with same configuration will be described in a representative embodiment by using the same reference numeral, and different configuration from the representative embodiment will be described in other embodiment.

Other words used to describe the relationship between elements should be interpreted in a like fashion such as "between" versus "directly between", "adjacent" versus "directly adjacent", etc. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinbelow, according to the present disclosure, a substrate transfer module and semiconductor manufacturing equipment including the same, the substrate transfer module is configured to maintain clean environment by preventing particles from being transferred to a substrate.

FIG. 1 is a view showing a schematic structure of semiconductor manufacturing equipment 1 to which the present disclosure may be applied. The semiconductor manufacturing equipment 1 to which the present disclosure may be applied is an apparatus for performing a semiconductor treatment process such as etching, cleaning, coating, developing, depositing, etc., and the present disclosure is not limited to an apparatus for a specific process and can be applied to any kind of equipment.

According to the embodiment of the present disclosure, the semiconductor manufacturing equipment 1 includes a loading part 10 accommodating a cassette F in which a substrate is stored, and configured to remove the substrate out of the cassette F or to put the substrate into the cassette F, a process treatment module 20 performing a process treatment with respect to the substrate, and a substrate transfer module 30 configured to transfer the substrate between the loading part 10 and the process treatment module 20.

The loading part 10 includes a load port 12 and an index part 14, and the load port 12 is provided for the cassette F storing the substrate therein to be loaded, and the index part 14 removes the substrate out of the cassette F loaded on the load port 12 or puts the substrate that has been treated into the cassette F. A plurality of load ports 12 may be arranged at an outer portion of the semiconductor manufacturing equipment 1 in a specific direction (e.g., Y-axial direction), and after the cassette F transferred by an overhead hoist transport (OHT) is loaded thereon, a door of the cassette F can be opened. The index part 14 may be arranged adjacent to the load port 12. The index part 14 may include an index guide member 142 arranged in the arrangement direction (Y-axial direction) of the load port 12 and an index robot 144 transferring the substrate while moving along the index guide member 142. The index robot 144 may receive the substrate from the cassette F and transfer the substrate to a load lock chamber 15 in which the substrate is temporarily stored, and may receive the substrate that is temporarily stored in the load lock chamber 15 and transfer the substrate into the cassette F.

The process treatment module 20 is an apparatus in which a process treatment of the substrate is performed, and may include one process treatment chamber 200 or more. A plurality of process treatment chambers 200 may be arranged in a specific direction (e.g., X-axial direction). Each of the process treatment chambers 200 may perform the same process or different processes. For example, a part of the process treatment chambers 200 may perform the etching process with respect to a substrate, and a remaining part of the process treatment chambers 200 may perform a cleaning treatment with respect to the etched substrate.

The substrate transfer module 30 is arranged adjacent to the process treatment module 20, and may receive a substrate from the load lock chamber 15 and transfer the substrate to the process treatment module 20, or may transfer a substrate that has been treated in the process treatment module 20 to the load lock chamber 15. The substrate transfer module 30 may include a guide member 330 and a substrate transfer robot 340, and the guide member 330 may be arranged in a direction (X-axial direction) of an arrangement direction of the process treatment chambers 200 and the substrate transfer robot 340 may move along the guide member 330 and transfer the substrate.

A structure of the substrate transfer module 30 of according to the present disclosure will be described in detail. In the below description, the case where the present disclosure is applied to the substrate transfer module 30 of the semiconductor manufacturing equipment 1 is exemplified, but the present disclosure may be applied to any type of device (e.g., the index part 14) transferring the substrate.

In a case of a movable device such as the substrate transfer robot 340, friction is caused by movement and particles may be generated by the friction. The particles generated in the substrate transfer module 30 may adhere to the substrate, and the particles may cause in a decrease in the yield in a process treatment. Therefore, the present disclosure provides the substrate transfer module 30 and the semiconductor manufacturing equipment 1 including the same, wherein the substrate transfer module 30 is configured to collect the particles generated in the process of transferring the substrate in the substrate transfer module 30 and discharge the particles, thereby preventing the particles from being transferred to the substrate and improving the cleanliness in a manufacturing process.

Figure 2:
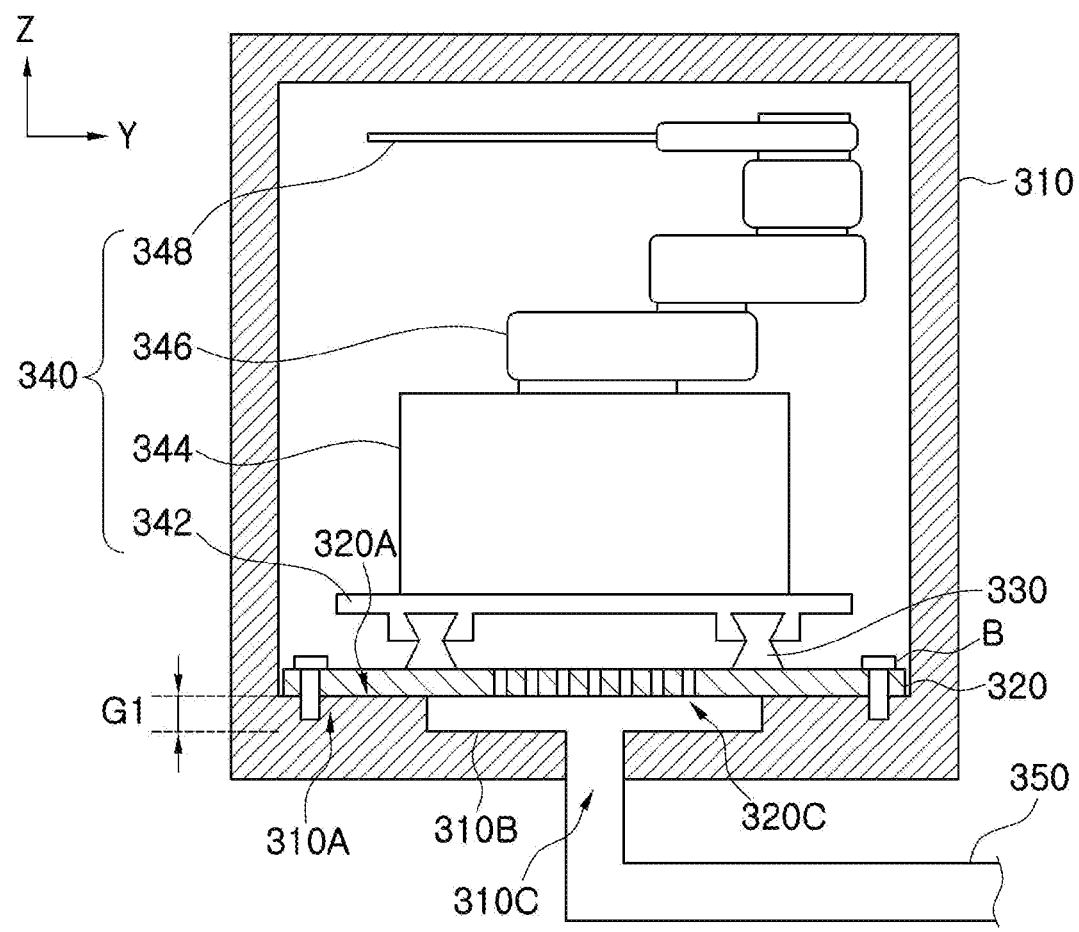
FIGS. 2 and 3 are views showing a structure of substrate transfer module according to a first embodiment of the present disclosure.
Figure 3:
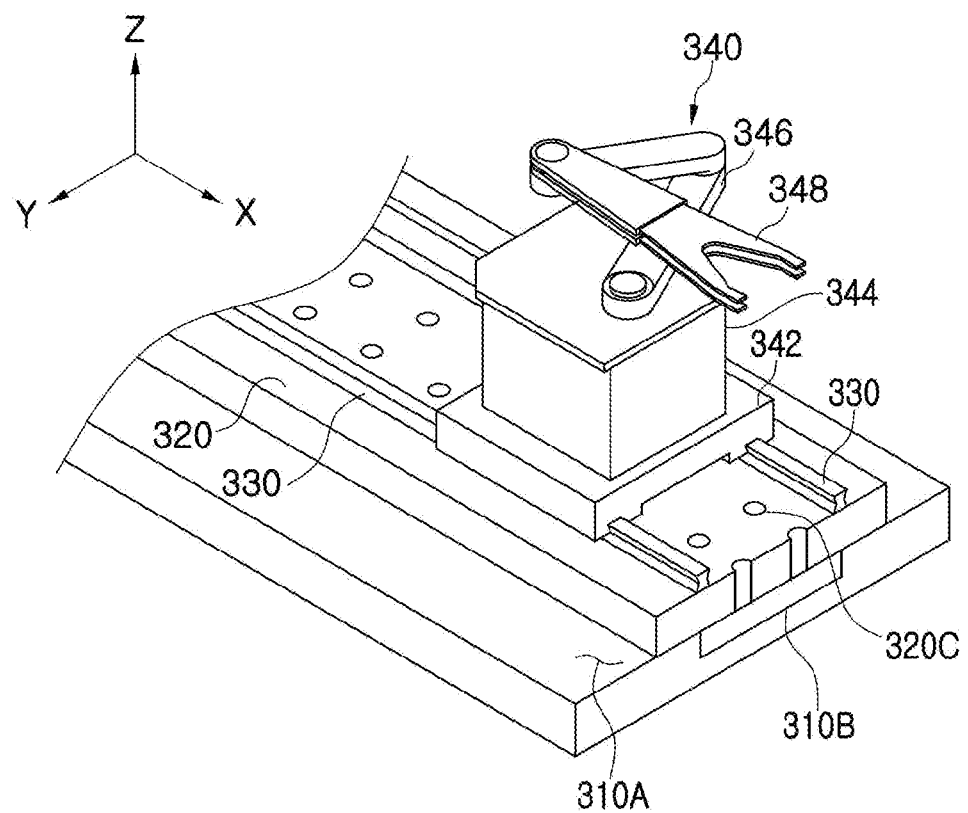

FIGS. 2 and 3 are views showing a structure of substrate transfer module according to a first embodiment of the present disclosure. FIG. 2 is a sectional view showing a lateral portion of the substrate transfer module 30, and FIG. 3 is a perspective view showing a structure of the substrate transfer robot 340.

According to a first embodiment of the present disclosure, the substrate transfer module 30 includes a transfer chamber 310, the guide member 330, and the substrate transfer robot 340. The transfer chamber 310 provides a transfer space of the substrate and has a chamber groove 310B lowered from a bottom surface 310A by a predetermined height to form a gap G1 with respect to an the bottom surface 310A, the guide member 330 is mounted to an inside portion of the transfer chamber 310, and the substrate transfer robot 340 transfers the substrate while moving along the guide member 330. A base plate 320 may be mounted to an upper end of the bottom surface 310A of the transfer chamber 310, and the guide member 330 may be mounted to an upper end of the base plate 320.

According to the present disclosure, the particles P generated the movement of the substrate transfer robot 340 or other causes are collected in the space formed by the gap G1 between the chamber groove 310B and the base plate 320, the chamber groove 310B being formed in a lower portion of the transfer chamber 310. Therefore, the present disclosure can prevent the particles P from adhering to the substrate in the substrate transfer module 30 and the cleanliness of the semiconductor manufacturing equipment 1 is improved, so that a decrease in process yield when the particles P adhere to the substrate can be prevented.

As shown in FIG. 1, the transfer chamber 310 may have a rectangular shape in the arrangement direction (X-axial direction) of the process treatment chamber 200, and the transfer chamber 310 provides a moving space for the substrate transfer robot 340 transferring the substrate. Although not shown in the drawings, a door may be arranged on a lateral wall of the transfer chamber 310 to insert the substrate into the process treatment chamber 200. According to the embodiment of the present disclosure, the lower portion of the transfer chamber 310 may include the bottom surface 310A and the chamber groove 310B lowered by the predetermined gap G1 from the bottom surface 310A.

The base plate 320 is securely mounted to the bottom surface 310A of the transfer chamber 310, and a pair of guide members 330 may be mounted to an upper portion of the base plate 320. The base plate 320 may be securely mounted to the bottom surface 310A by fastening members B (e.g., bolts). According to the embodiment of the present disclosure, the gap G1 may be formed between the base plate 320 and the chamber groove 310B, and the particles P may be collected in the space formed by the gap G1.

The guide member 330 is mounted to the upper portion of the base plate 320, and provide a moving path of the substrate transfer robot 340. The pair of guide members 330 may be provided at opposite lateral surfaces in the X-axial direction.

As shown in FIG. 3, the substrate transfer robot 340 transfers the substrate while moving the inside space of the transfer chamber 310. The substrate transfer robot 340 includes a linear driving part 342 configured to move along the guide members, a robot arm part 346 including arm members rotatably driven on a plurality of shafts to handle the substrate, an arm driving part 344 controlling a movement of the robot arm part 346, and a robot hand part 348 coupled to the robot arm part 346 and support a lower portion of the substrate.

Figure 4:
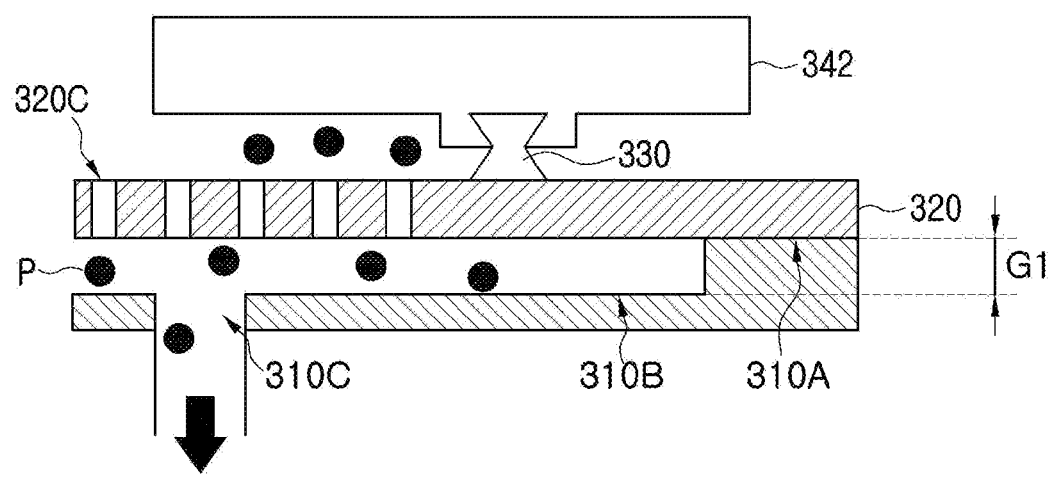
FIG. 4 is a view showing a process in which particles are discharged from the substrate transfer module according to the first embodiment of the present disclosure.
Figure 5:
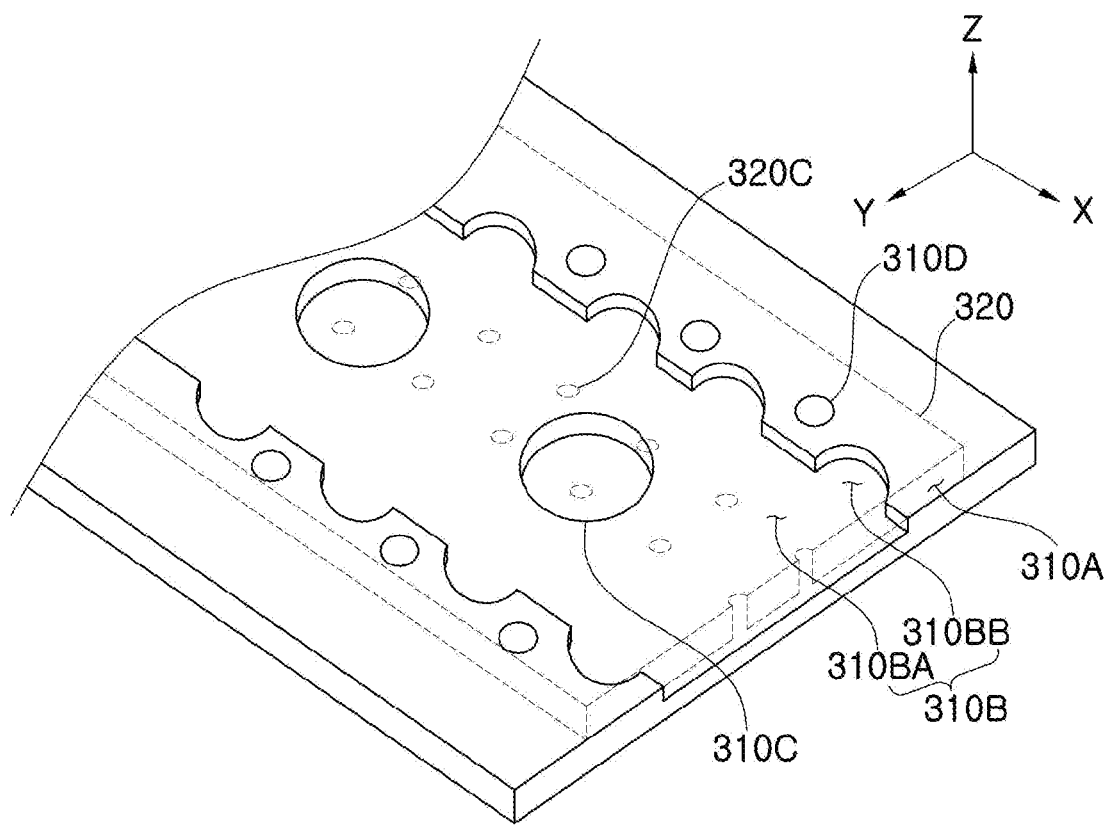
FIG. 5 is a view showing a structure of a bottom surface of a transfer chamber of the substrate transfer module according to the first embodiment of the present disclosure.

According to the embodiment, a plurality of through holes 320C may be formed in a region of the base plate 320, the region corresponding to the chamber groove 310B. As shown in FIG. 2, the plurality of the through holes 320C may be formed in the center region of the base plate 320, the particles P move though the through holes 320C so that the particles P may be collected in the space between the base plate 320 and the chamber groove 310B. As shown in FIG. 4, the particles P may be generated by the friction between the guide members 330 and the linear driving part 342, and the particles P may move into the space between the base plate 320 and the chamber groove 310B via the through holes 320C formed in the base plate 320.

Figure 6A:
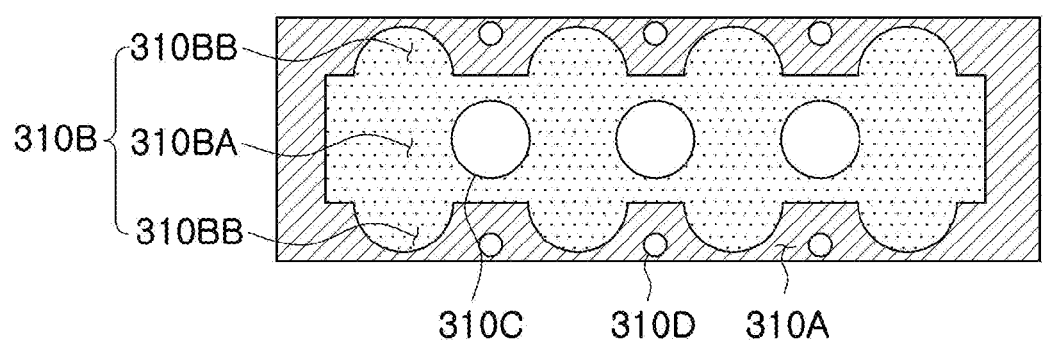
FIGS. 6A and 6B are views showing a structure of the bottom surface and a base plate of the transfer chamber of the substrate transfer module according to the first embodiment of the present disclosure.
Figure 6B:
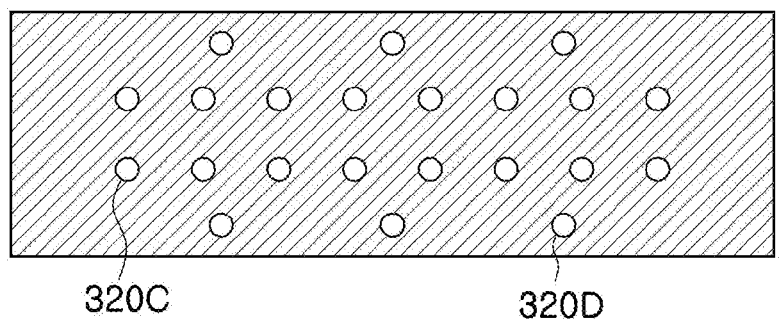

According to the embodiment of the present disclosure, the chamber groove 310B may include a chamber groove center portion 310BA and plurality of the chamber groove pattern portions 310BB, and the chamber groove center portion 310BA is formed in a center region of the lower portion of the transfer chamber 310 and the plurality of the chamber groove pattern portions 310BB protrude on lateral surfaces of the chamber groove center portion 310BA. As shown in FIGS. 6A and 6B, the chamber groove 310B may include the chamber groove center portion 310BA formed wide in the center portion of the lower portion of the transfer chamber 310, and the chamber groove pattern portions 310BB are shaped into patterns having constant intervals on opposite lateral surfaces of the chamber groove center portion 310BA.

According to the embodiment of the present disclosure, in regions between the chamber groove pattern portions 310BB, fastening holes 310D, 320D are respectively formed in the base plate 320 and the bottom surface 310A, and the base plate 320 may be securely mounted to the bottom surface 310A by the fastening members B coupled to the fastening holes 310D of the bottom surface 310A. As shown in FIGS. 6A and 6B, the fastening holes 310D, 320D are formed in the base plate 320 and the bottom surface 310A at constant intervals, and the chamber groove pattern portions 310BB may be provided to provide more wider particle collecting space between the fastening holes 310D, 320D.

According to the embodiment of the present disclosure, at least one opening portion 310C may be formed in the chamber groove 310B. As shown in FIGS. 2 to 5, the chamber groove 310B may have at least one opening portion 310C, and the particles P collected in the space between the base plate 320 and the chamber groove 310B may escape via the opening portion 310C.

According to the embodiment of the present disclosure, the opening portion 310C may be connected to a discharge tube 350 discharging air inside the transfer chamber 310. The discharge tube 350 communicates with the opening portion 310C, and the particles P may be discharged with the air inside the transfer chamber 310 by internal pressure difference between the discharge tube 350 and the transfer chamber 310. A descending current is formed in the transfer chamber 310 by the pressure difference between the discharge tube 350 and the transfer chamber 310, and the descending current allows the particles P to be collected in the space between the base plate 320 and the chamber groove 310B without being blown to the substrate or other devices and to be discharged along the discharge tube 350.

According to the embodiment of the present disclosure, the particles P collected in the space between the base plate 320 and the chamber groove 310B may be discharged to the outside space vacuum pressure applied to the discharge tube 350. The vacuum pressure applied to the discharge tube 350 causes the pressure difference between the discharge tube 350 and the transfer chamber 310, and the pressure difference forms the descending current inside the transfer chamber 310. The particles P collected in the space between the base plate 320 and the chamber groove 310B may be discharged to the outside space by the vacuum pressure applied to the discharge tube 350.

Hereinabove, as the first embodiment of the present disclosure, the substrate transfer module 30 with the bottom surface 310A of the transfer chamber 310 having the groove was described. Furthermore, as a second embodiment of the present disclosure, a groove is formed on a lower surface of the base plate 320 so that a space may be formed between the base plate 320 and the bottom surface 310A of the transfer chamber 310.

Figure 7:
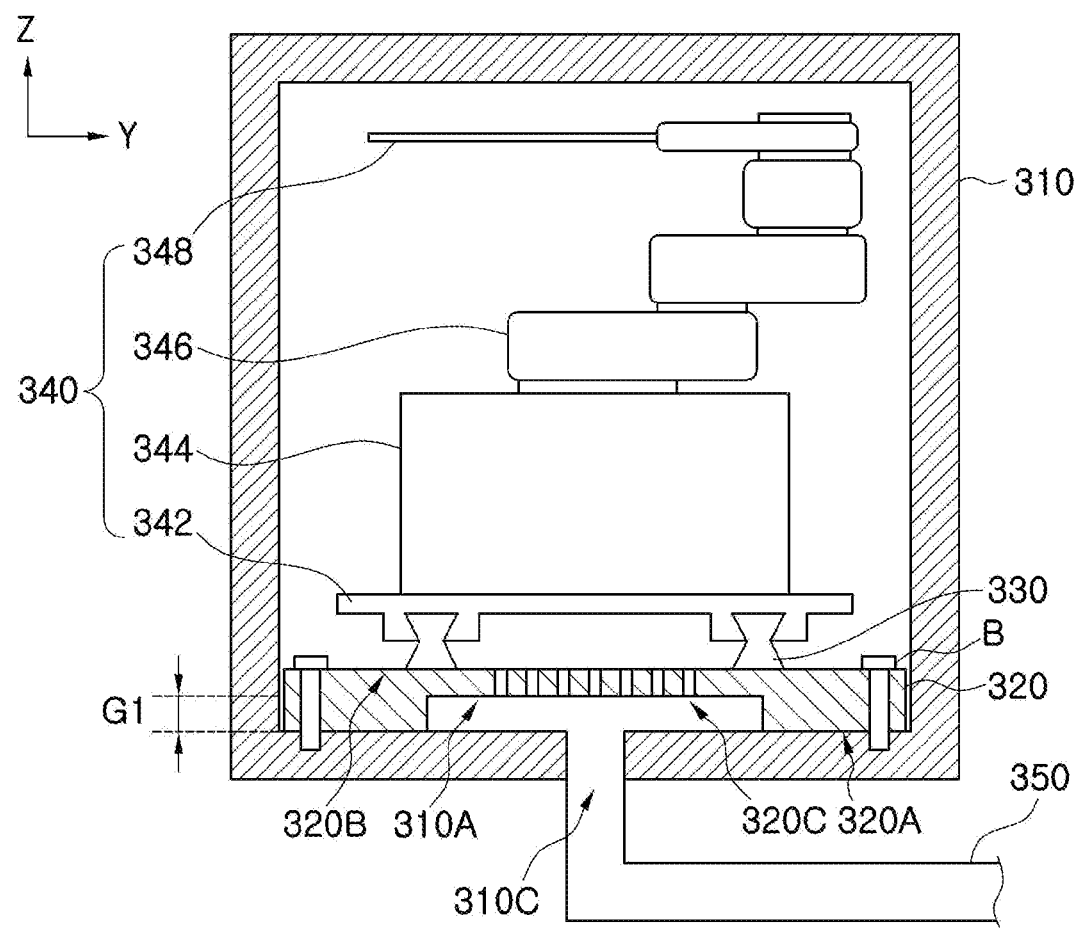
FIG. 7 is a view showing the substrate transfer module according to a second embodiment of the present disclosure.

FIG. 7 is a view showing a structure of the substrate transfer module 30 according to the second embodiment of the present disclosure.

According to the another embodiment of the present disclosure, the substrate transfer module 30 of the semiconductor manufacturing equipment 1 includes the transfer chamber 310 providing the transfer space of the substrate, the base plate 320 including a mounting portion 320A securely mounted to the bottom surface 310A of the transfer chamber 310 and a plate groove 320B located above the mounting portion 320A by a predetermined height to form a gap G2 with respect to the mounting portion 320A, the guide members 330 mounted to the upper end of the base plate 320, and the substrate transfer robot 340 transferring the substrate while moving along the guide members 330.

According to the embodiment, the particles P generated by the movement of the substrate transfer robot 340 or other causes are collected in the space formed by the gap G2 between the plate groove 320B of the base plate 320 and the bottom surface 310A located at the lower portion of the transfer chamber 310. Therefore, the present disclosure can prevent the particles P from adhering to the substrate in the substrate transfer module 30 and the cleanliness of the semiconductor manufacturing equipment 1 is improved, so that a decrease in process yield when the particles P adhere to the substrate can be prevented.

As shown in FIG. 1, the transfer chamber 310 may have a rectangular shape in the arrangement direction (X-axial direction) of the process treatment chamber 200, and the transfer chamber 310 provides a moving space for the substrate transfer robot 340 transferring the substrate. Although not shown in the drawings, a door may be arranged on a lateral wall of the transfer chamber 310 to insert the substrate into the process treatment chamber 200.

The base plate 320 is securely mounted to the bottom surface 310A of the transfer chamber 310, and a pair of guide members 330 may be mounted to an upper portion of the base plate 320. The base plate 320 may be securely mounted to the bottom surface 310A by the fastening members B (e.g., bolts). According to the embodiment of the present disclosure, the mounting portion 320A securely mounted to the bottom surface 310A of the transfer chamber 310 and the plate groove 320B located above the mounting portion 320A by the predetermined height to form the gap G2 are formed at the lower portion of the base plate 320. Therefore, the space is formed by the gap G2 between the plate groove 320B of the base plate 320 and the bottom surface 310A of the transfer chamber 310 and the particles P may be collected in the space.

The guide member 330 is mounted to the upper portion of the base plate 320, and provide a moving path of the substrate transfer robot 340. The pair of guide members 330 may be provided at opposite lateral surfaces in the X-axial direction.

The substrate transfer robot 340 transfers the substrate while moving inside the transfer chamber 310. The substrate transfer robot 340 includes a linear driving part 342 configured to move along the guide members, a robot arm part 346 including arm members rotatably driven on a plurality of shafts to handle the substrate, an arm driving part 344 controlling a movement of the robot arm part 346, and a robot hand part 348 coupled to the robot arm part 346 and support a lower portion of the substrate.

Figure 8:
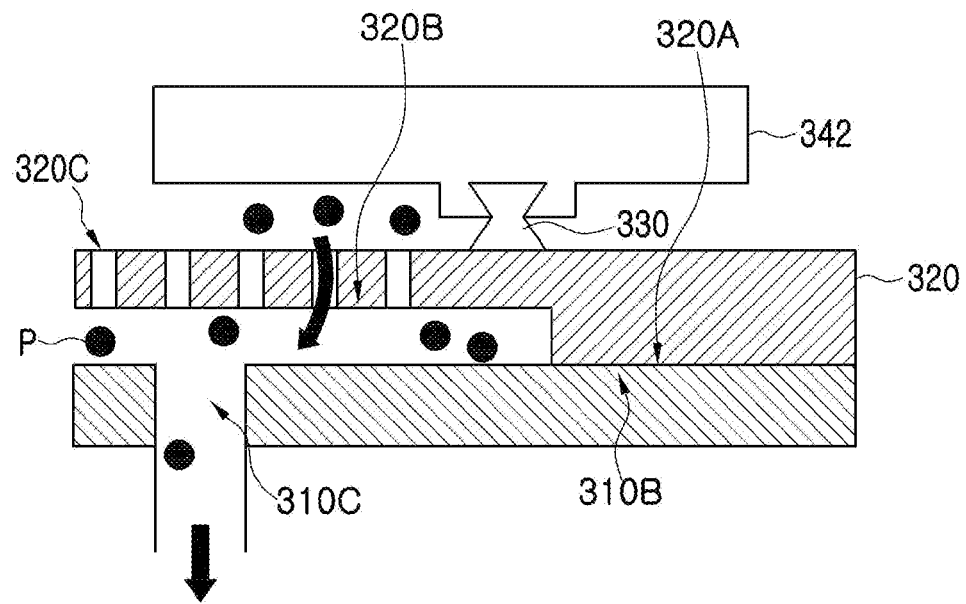
FIG. 8 is a view showing a process in which particles are discharged from the substrate transfer module according to the second embodiment of the present disclosure.

According to the embodiment, the plurality of the through holes 320C may be formed in the plate groove 320B of the base plate 320. As shown in FIGS. 7, 8, 9B, the plurality of the through holes 320C may be formed at the center portion of the base plate 320, and the particles P move through the through holes 320C, thereby being collected in the space between the plate groove 320B of the base plate 320 and the bottom surface 310A of the lower portion of the transfer chamber 310. As shown in FIG. 8, the particles P may be generated by the friction between the guide member 330 and the linear driving part 342, and the particles P may move into the space between the plate groove 320B of the base plate 320 and the bottom surface 310A of the transfer chamber 310 along the through holes 320C formed in the base plate 320.

Figure 9A:
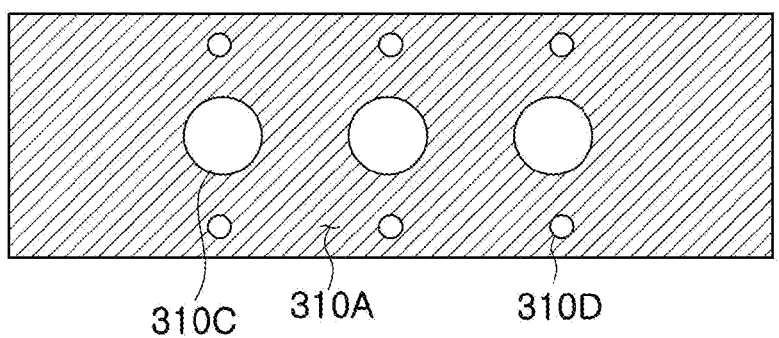
FIGS. 9A and 9B are views showing a structure of the bottom surface of the transfer chamber and the base plate in the substrate transfer module according to the second embodiment of the present disclosure.
Figure 9B:
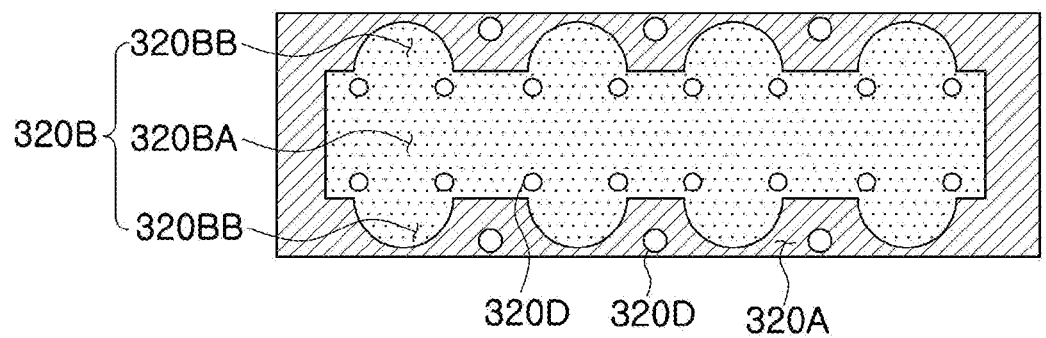

FIGS. 9A and 9B are views showing a structure of the bottom surface 310A of the transfer chamber 310 and the lower surface of the base plate 320 in the substrate transfer module 30 according to the second embodiment of the present disclosure. According to the embodiment of the present disclosure, the plate groove 320B may include a plate groove center portion 320BA and plurality of the plate groove pattern portions 320BB, and the plate groove center portion 320BA is formed in the center region of the lower surface and the plurality of plate groove pattern portions 320BB protrudes on opposite lateral surfaces of the plate groove center portion 320BA. As shown in FIGS. 9A and 9B, the plate groove 320B may include the plate groove center portion 320BA formed wide at the center portion and the plate groove pattern portions 320BB shaped into patterns having constant intervals at the opposite lateral surfaces of the plate groove center portion 320BA.

According to the embodiment of the present disclosure, in regions between the plate groove pattern portions 320BB, the fastening holes 310D, 320D are respectively formed in the base plate 320 and the bottom surface 310A, and the base plate 320 may be securely mounted to the bottom surface 310A by the fastening members B coupled to the fastening holes 310D, 320D. As shown in FIGS. 9A and 9B, the fastening holes 320D are formed in the base plate 320 at constant intervals, and the plate groove pattern portions 320BB may be provided to provide more wider particle collecting space between the fastening holes 320D.

According to the embodiment of the present disclosure, at least one opening portion 310C may be formed in the bottom surface 310A of the transfer chamber 310. As shown in FIGS. 7, 8, 9A, the bottom surface 310A of the transfer chamber 310 has at least one opening portion 310C, and the particles P collected in the space between the plate groove 320B of the base plate 320 and the bottom surface 310A of the transfer chamber 310 may be discharged through the opening portion 310C.

According to the embodiment of the present disclosure, the opening portion 310C may be connected to a discharge tube 350 discharging air inside the transfer chamber 310. The discharge tube 350 communicates with the opening portion 310C, and the particles P may be discharged with the air inside the transfer chamber 310 by internal pressure difference between the discharge tube 350 and the transfer chamber 310. A descending current is formed in the transfer chamber 310 by the pressure difference between the discharge tube 350 and the transfer chamber 310, and the descending current allows the particles P to be collected in the space between the plate groove 320B and the bottom surface 310A without being blown to the substrate or other devices and to be discharged along the discharge tube 350.

According to the embodiment of the present disclosure, the particles P collected in the space between the base plate 320 and the chamber groove 310B may be discharged to the outside space vacuum pressure applied to the discharge tube 350. The vacuum pressure applied to the discharge tube 350 causes the pressure difference between the discharge tube 350 and the transfer chamber 310, and the pressure difference forms the descending current inside the transfer chamber 310. The particles P collected in the space between the plate groove 320B and the bottom surface 310A may be discharged to the outside space by the vacuum pressure applied to the discharge tube 350.

As a third embodiment of the present disclosure, the substrate transfer module 30 in which grooves are respectively formed in the lower portion of the transfer chamber 310 and the lower portion of the base plate 320 to collect and discharge the particles P will be described.

Figure 10:
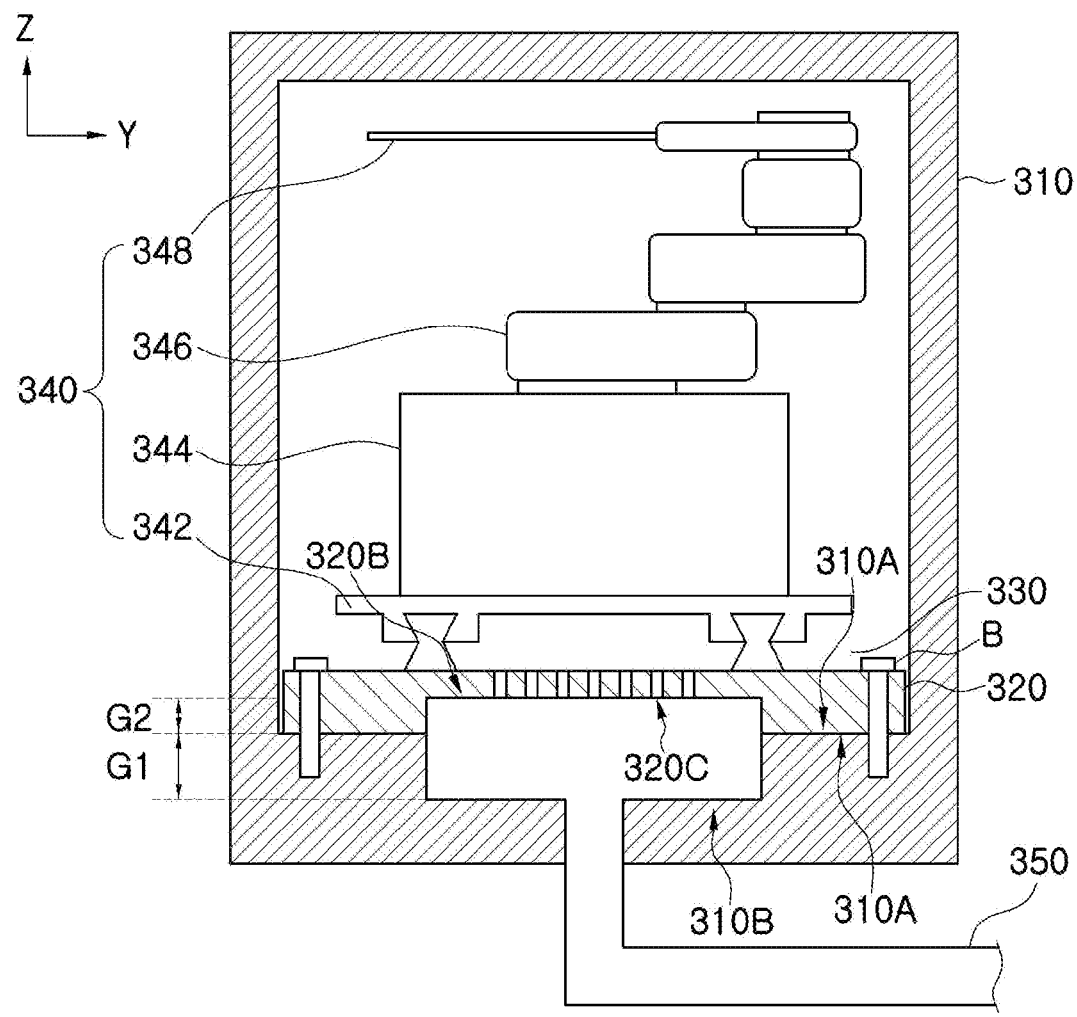
FIG. 10 is a view showing a structure of the substrate transfer module according to a third embodiment of the present disclosure.

FIG. 10 is a view showing a structure of the substrate transfer module 30 according to the third embodiment of the present disclosure. According to the embodiment, the substrate transfer module 30 includes the transfer chamber 310 providing the transfer space of the substrate, and having the chamber groove 310B lowered from the bottom surface 310A by a predetermined height to form a first gap G1 with respect to the bottom surface 310A, the base plate 320 including the mounting portion 320A securely mounted to the bottom surface 310A of the transfer chamber 310 and the plate groove 320B located above the mounting portion 320A by a predetermined height to form a second gap G2 with respect to the mounting portion 320A, the guide member 330 mounted to the upper end of the base plate 320, and the substrate transfer robot 340 transferring the substrate while moving along the guide member 330.

According to the embodiment, the particles P generated by the movement of the substrate transfer robot 340 or other causes are collected in a space formed by the gap G1, G2 between the plate groove 320B of the base plate 320 and the chamber groove 310B of the transfer chamber 310. Therefore, the present disclosure can prevent the particles P from adhering to the substrate in the substrate transfer module 30 and the cleanliness of the semiconductor manufacturing equipment 1 is improved, so that a decrease in process yield when the particles P adhere to the substrate can be prevented.

As shown in FIG. 1, the transfer chamber 310 may have a rectangular shape in the arrangement direction (X-axial direction) of the process treatment chamber 200, and the transfer chamber 310 provides a moving space for the substrate transfer robot 340 transferring the substrate. Although not shown in the drawings, a door may be arranged on a lateral wall of the transfer chamber 310 to insert the substrate into the process treatment chamber 200.

The base plate 320 is securely mounted to the bottom surface 310A of the transfer chamber 310, and a pair of guide members 330 may be mounted to an upper portion of the base plate 320. The base plate 320 may be securely mounted to the bottom surface 310A by fastening members B (e.g., bolts).

According to the embodiment of the present disclosure, the chamber groove 310B is formed in the lower portion of the transfer chamber 310 by being lowered from the bottom surface 310A by the predetermined height to form the first gap G1. Furthermore, the mounting portion 320A and the plate groove 320B are formed at the lower portion of the base plate 320, and the mounting portion 320A is securely mounted to the bottom surface 310A of the transfer chamber 310 and the plate groove 320B is located above the mounting portion 320A by the predetermined height to form the second gap G2. Therefore, the space formed by the gap G1, G2 is formed between the plate groove 320B of the base plate 320 and the chamber groove 310B of the transfer chamber 310 and the particles P may be collected in the space.

The guide member 330 is mounted to the upper portion of the base plate 320, and provide a moving path of the substrate transfer robot 340. The pair of guide members 330 may be provided at opposite lateral surfaces in the X-axial direction.

The substrate transfer robot 340 transfers the substrate while moving inside the transfer chamber 310. The substrate transfer robot 340 includes a linear driving part 342 configured to move along the guide members, a robot arm part 346 including arm members rotatably driven on a plurality of shafts to handle the substrate, an arm driving part 344 controlling a movement of the robot arm part 346, and a robot hand part 348 coupled to the robot arm part 346 and support a lower portion of the substrate.

Figure 11:
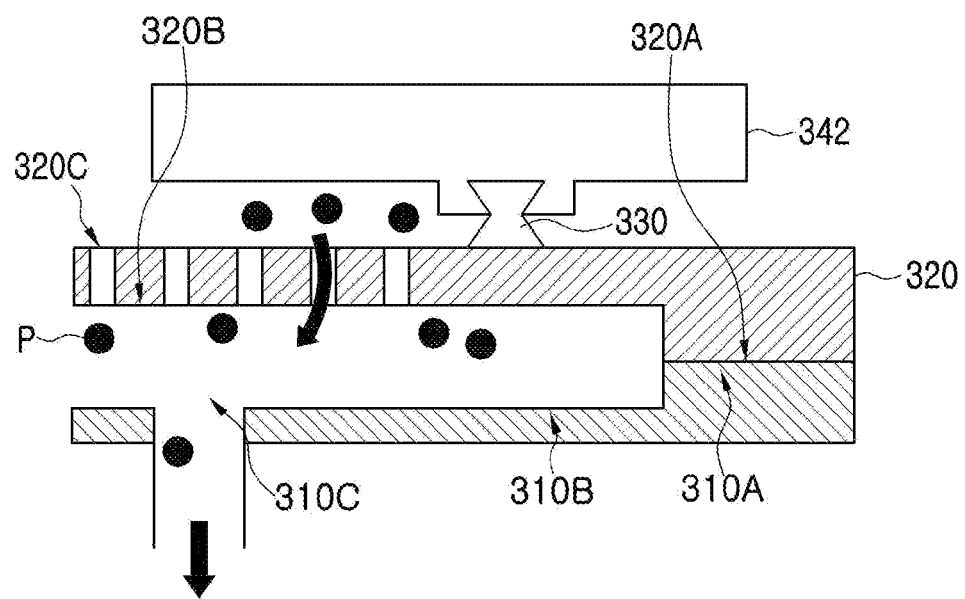
FIG. 11 is a view showing a process in which particles are discharged from the substrate transfer module according to the third embodiment of the present disclosure.

According to the embodiment, the plurality of the through holes 320C may be formed in the plate groove 320B of the base plate 320. As shown in FIGS. 10 and 11, the plurality of the through holes 320C may be formed at the center portion of the base plate 320, and the particles P move through the through holes 320C, thereby being collected into the space between the plate groove 320B of the base plate 320 and the chamber groove 310B of the transfer chamber 310. As shown in FIG. 11, the particles P may be generated by the friction between the guide member 330 and the linear driving part 342, and the particles P may move into the space between the plate groove 320B of the base plate 320 and the chamber groove 310B of the transfer chamber 310 along the through holes 320C formed in the plate groove 320B of the base plate 320.

Figure 12A:
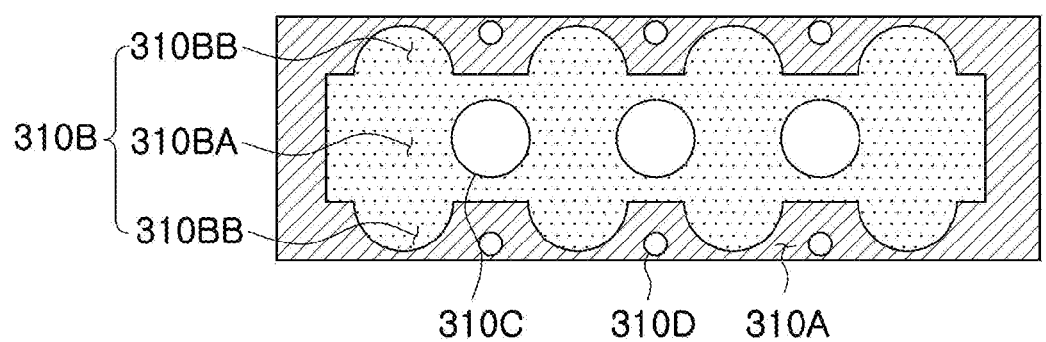
FIGS. 12A and 12B are views showing a structure of the bottom surface and the base plate of the transfer chamber of the substrate transfer module according to the third embodiment of the present disclosure.
Figure 12B:
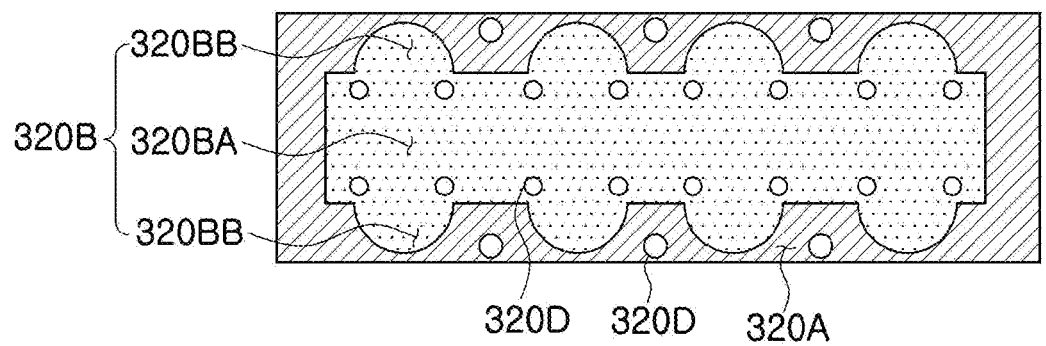

FIG. 12A is a view showing shapes of the bottom surface 310A and the chamber groove 310B of the transfer chamber 310, and FIG. 12B is a view showing shapes of the mounting portion 320A and the plate groove 320B located at the lower surface of the base plate 320. According to the embodiment of the present disclosure, the chamber groove 310B includes the chamber groove center portion 310BA formed at the center region of the bottom surface 310A and the plurality of chamber groove pattern portions 310BB protruding from the lateral surfaces of the chamber groove center portion 310BA, and the plate groove 320B may include the plate groove center portion 320BA formed at the center region of the lower surface thereof and the plurality of plate groove pattern portions 320BB protruding from the opposite lateral surfaces of the plate groove center portion 320BA.

According to the embodiment of the present disclosure, the fastening holes 310D, 320D are respectively formed in the regions of the bottom surface 310A and the mounting portion 320A, the regions corresponding to intervals between the chamber groove pattern portions 310BB, and the base plate 320 may be securely mounted to the bottom surface 310A by the fastening members B coupled to the fastening holes 310D, 320D. As shown in FIGS. 12A and 12B, the fastening holes 310D, 320D are formed in the bottom surface 310A of the transfer chamber 310 and the base plate 320 at constant intervals, and the plate groove pattern portions 320BB and the chamber groove pattern portions 310BB may be provided to provide more wider particle collecting space between the fastening holes 310D, 320D.

According to the embodiment of the present disclosure, at least one opening portion 310C may be formed in the chamber groove 310B of the transfer chamber 310. As shown in FIGS. 10 and 11, the chamber groove 310B of the transfer chamber 310 has at least one opening portion 310C, and the particles P collected in the space between the plate groove 320B of the base plate 320 and the chamber groove 310B may be discharged through the opening portion 310C.

According to the embodiment of the present disclosure, the opening portion 310C may be connected to a discharge tube 350 discharging air inside the transfer chamber 310. The discharge tube 350 communicates with the opening portion 310C, and the particles P may be discharged with the air inside the transfer chamber 310 by internal pressure difference between the discharge tube 350 and the transfer chamber 310. A descending current is formed in the transfer chamber 310 by the pressure difference between the discharge tube 350 and the transfer chamber 310, and the descending current allows the particles P to be collected in the space between the plate groove 320B and the chamber groove 310B without being blown to the substrate or other devices and to be discharged along the discharge tube 350.

According to the embodiment of the present disclosure, the particles P collected in the space between the base plate 320 and the chamber groove 310B may be discharged to the outside space vacuum pressure applied to the discharge tube 350. The vacuum pressure applied to the discharge tube 350 causes the pressure difference between the discharge tube 350 and the transfer chamber 310, and the pressure difference forms the descending current inside the transfer chamber 310. The particles P collected in the space between the base plate 320 and the chamber groove 310B may be discharged to the outside space by the vacuum pressure applied to the discharge tube 350.

Meanwhile, the embodiment described above is about the structure of the substrate transfer robot 340 with the robot arm part 346 and the substrate transfer module 30 including the same, the robot arm part 346 including a linear drive part to which a linear motor is applied and polyarticular arm members.

Figure 13:
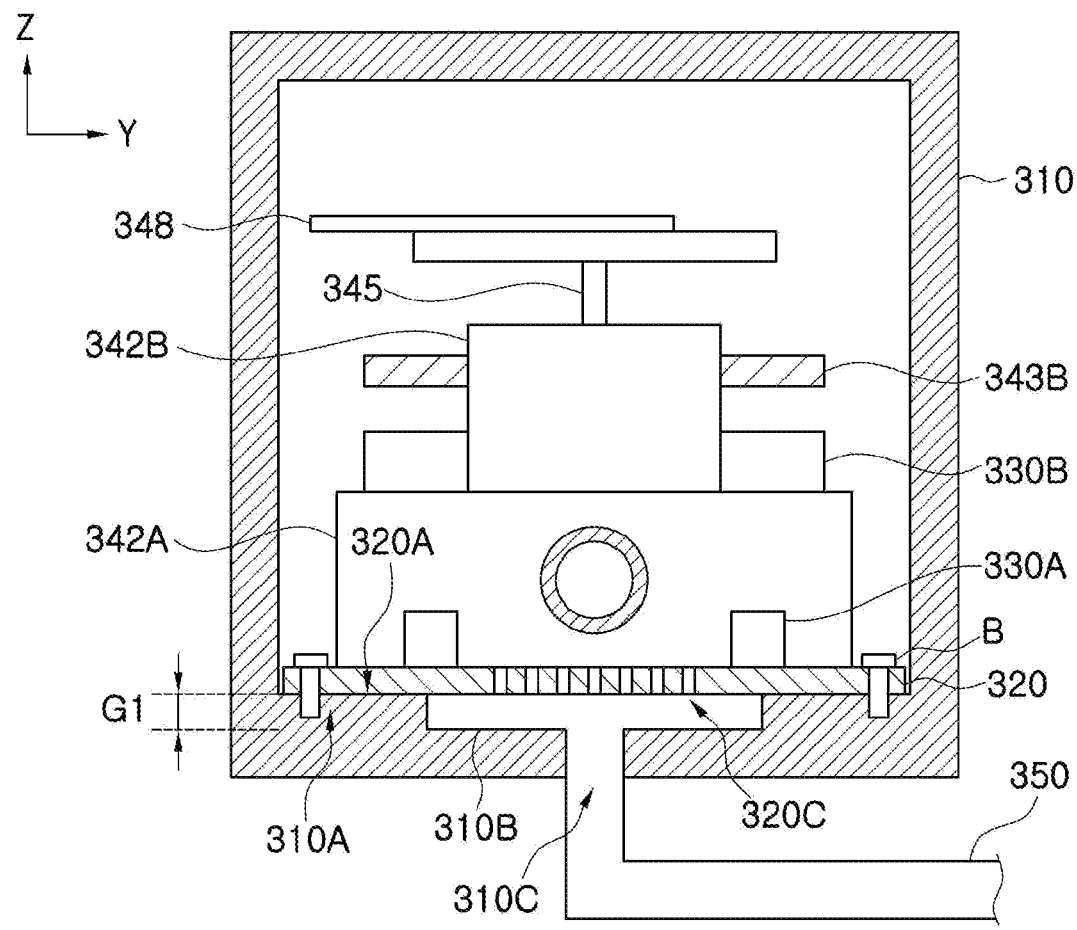
FIG. 13 is a view showing the substrate transfer module to which a ball screw structure is applied.

However, the embodiment of the present disclosure is not limited to the above description, and may be applied to various types of the substrate transfer robot 340. As shown in FIG. 13, the substrate transfer robot 340 may include an X-axis ball screw device 343A and X-axis guide members 330A that move an X-axis linear drive part 342A in an X-axial direction for X-axial movement of the robot hand part 348, and a Y-axis ball screw device 343B and Y-axis guide members 330B that move a Y-axis linear drive part 342B in a Y-axial direction for Y-axial movement of the robot hand part 348. Meanwhile, the robot hand part 348 is coupled to a rotating shaft 345 and operates rotation, forward movement, and rearward movement with respect to the Y-axis linear drive part 342B so as to transfer a wafer W.

The X-axis linear drive part 342A and the Y-axis linear drive part 342B may be moved in the horizontal direction (X, Y-axial direction) by rotations of the X-axis ball screw device 343A and the Y-axis ball screw device 343B. A plurality of particles may be generated by the friction of the X-axis guide members 330A and the Y-axis guide members 330B with the rotations of the X-axis ball screw device 343A and the Y-axis ball screw device 343B, and as described above, the chamber groove 310B of the present disclosure is formed on the bottom surface 310A so as to allow the particles to be discharged to the outside space without being blown.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims. Since the present disclosure may be embodied in other specific foams without changing the technical sprit or essential features, those skilled in the art to which the present disclosure belongs should understand that the embodiments described above are exemplary and not intended to limit the present disclosure.

The scope of the present disclosure will be defined by the accompanying claims rather than by the detailed description, and those skilled in the art should understand that various modifications, additions and substitutions derived from the meaning and scope of the present disclosure and the equivalent concept thereof are included in the scope of the present disclosure.

What is claimed is:

1. A substrate transfer module of semiconductor manufacturing equipment, the substrate transfer module comprising:
    a transfer chamber providing a transfer space of a substrate, having a chamber groove having a groove bottom surface lowered by a predetermined height from an inner bottom surface of the transfer chamber to form a gap with respect to the inner bottom surface of the transfer chamber;
    a guide member provided in an inside portion of the transfer chamber; and
    a substrate transfer robot configured to move along the guide member and to transfer the substrate.

2. The substrate transfer module of claim 1, further comprising:
    a base plate having a bottom surface having a first bottom surface region contacting the inner bottom surface of the transfer chamber and a second bottom surface region covering the groove bottom surface,
    wherein the second bottom surface region and the groove bottom surface defines the gap, and
    wherein the guide member is provided at an upper surface of the base plate, and
    a plurality of through holes extending from the upper surface of the base plate to the second bottom surface region of the base plate,
    wherein the plurality of through holes are connected to the gap.

3. The substrate transfer module of claim 2,
    wherein the chamber groove has a chamber groove center portion and a plurality of chamber groove pattern portions, the chamber groove center portion being formed at a center region of the bottom surface and the plurality of chamber groove pattern portions protruding on opposite lateral surfaces of the chamber groove center portion.

4. The substrate transfer module of claim 3,
    wherein fastening holes are respectively formed on the base plate and the bottom surface in regions between the plurality of chamber groove pattern portions, and
    the base plate is securely provided on the bottom surface by fastening members coupled to the fastening holes of the bottom surface.

5. The substrate transfer module of claim 2,
    wherein at least one opening portion is formed at the groove bottom surface of the chamber groove and extends from the groove bottom surface to an outer bottom surface of the transfer chamber.

6. The substrate transfer module of claim 5,
    wherein the at least one opening portion is connected to a discharge tube configured to discharge air inside the transfer chamber to an outside space.

7. The substrate transfer module of claim 6,
    wherein vacuum pressure applied to the discharge tube allows particles collected inside a space between the base plate and the chamber groove to be discharged to the outside space.

8. A substrate transfer module of semiconductor manufacturing equipment, the substrate transfer module comprising:
- a transfer chamber providing a transfer space of a substrate;
- a base plate comprising a mounting portion and a plate groove, the mounting portion being securely mounted to a bottom surface of the transfer chamber and the plate groove located above the mounting portion by a predetermined height to form a gap with respect to the mounting portion, wherein the mounting portion contacts the bottom surface of the transfer chamber, wherein the plate groove has a recessed surface recessed toward a top surface of the base plate from the bottom surface of the transfer chamber, and wherein the recessed surface corresponds to an upper surface of the gap;
- a guide member provided at an upper end of the base plate; and
- a substrate transfer robot configured to move along the guide member and to transfer the substrate.

9. The substrate transfer module of claim 8,
wherein a plurality of through holes is formed on the plate groove of the base plate.

10. The substrate transfer module of claim 8,
wherein the plate groove has a plate groove center portion and a plurality of plate groove pattern portions, the plate groove center portion being formed at a center region of the bottom surface and the plurality of plate groove pattern portions protruding on opposite lateral surfaces of the plate groove center portion.

11. The substrate transfer module of claim 10,
wherein fastening holes are respectively formed on the bottom surface and the mounting portion in regions between the plurality of plate groove pattern portions, and
the base plate is securely provided in the bottom surface by fastening members coupled to the fastening holes.

12. The substrate transfer module of claim 8,
wherein at least one opening portion is formed on a region of the bottom surface of the transfer chamber, the region corresponding to the plate groove.

13. The substrate transfer module of claim 12,
wherein the at least one opening portion of the bottom surface is connected to a discharge tube configured to discharge air inside the transfer chamber to an outside space.

14. The substrate transfer module of claim 13,
wherein vacuum pressure applied to the discharge tube allows foreign materials collected between the base plate and the bottom surface to be discharged to the outside space.

15. Semiconductor manufacturing equipment comprising:
- a loading part accommodating a cassette in which a substrate is stored, and configured to remove the substrate out of the cassette or to put the substrate into the cassette;
- a process treatment module configured to perform process treatment with respect to the substrate; and
- a substrate transfer module configured to transfer the substrate between the loading part and the process treatment module,
wherein the substrate transfer module comprises:
- a transfer chamber providing a transfer space of the substrate, and having a chamber groove having a groove bottom surface lowered by a predetermined height from an inner bottom surface of the transfer chamber to form a first gap with respect to the inner bottom surface of the transfer chamber and having at least one opening portion;
- a base plate comprising a mounting portion and a plate groove, the mounting portion being securely mounted to the inner bottom surface of the transfer chamber and the plate groove located above the mounting portion by a predetermined height to form a second gap with respect to the mounting portion, wherein the mounting portion contacts the inner bottom surface of the transfer chamber, wherein the plate groove has a recessed surface recessed toward a top surface of the base plate from the inner bottom surface of the transfer chamber, and wherein the recessed surface corresponds to an upper surface of the second gap;
- a guide member provided at an upper end of the base plate; and
- a substrate transfer robot configured to move along the guide member and to transfer the substrate.

16. The semiconductor manufacturing equipment of claim 15, wherein a plurality of through holes is formed on the plate groove of the base plate.

17. The semiconductor manufacturing equipment of claim 15,
wherein the chamber groove has a chamber groove center portion and a plurality of chamber groove pattern portions, the chamber groove center portion being formed at a center portion of the inner bottom surface and the plurality of chamber groove pattern portions protruding on a lateral surface of the chamber groove center portion, and
the plate groove has a plate groove center portion and a plurality of plate groove pattern portions, the plate groove center portion being formed at the center-portion of the inner bottom surface and the plurality of plate groove pattern portions protruding on opposite lateral surfaces of the plate groove center portion.

18. The semiconductor manufacturing equipment of claim 17,
wherein fastening holes are respectively formed on the inner bottom surface and the mounting portion in regions between the plurality of chamber groove pattern portions, and
the base plate is securely provided on the inner bottom surface by fastening members coupled to the fastening holes.

19. The semiconductor manufacturing equipment of claim 15,
wherein the at least one opening portion is connected to a discharge tube configured to discharge air inside the transfer chamber to an outside space.

20. The semiconductor manufacturing equipment of claim 19,
wherein vacuum pressure applied to the discharge tube allows foreign materials collected between the base plate and the inner bottom surface to be discharged to the outside space.

* * * * *